US009119312B2

(12) United States Patent
Kim et al.

(10) Patent No.: US 9,119,312 B2
(45) Date of Patent: Aug. 25, 2015

(54) SUPPORT DEVICE AND SYSTEM

(71) Applicant: FUJITSU LIMITED, Kawasaki-shi, Kanagawa (JP)

(72) Inventors: Huijun Kim, Kawasaki (JP); Takenori Kuwada, Kawasaki (JP); Sonomasa Kobayashi, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 256 days.

(21) Appl. No.: 13/850,785

(22) Filed: Mar. 26, 2013

(65) Prior Publication Data

US 2013/0279093 A1  Oct. 24, 2013

(30) Foreign Application Priority Data

Apr. 23, 2012 (JP) .................................. 2012-098220

(51) Int. Cl.
*H02B 1/01* (2006.01)
*G06F 1/16* (2006.01)
*H05K 5/00* (2006.01)
*H05K 7/00* (2006.01)
*H05K 7/10* (2006.01)

(52) U.S. Cl.
CPC ........... *H05K 7/10* (2013.01); *G06F 1/166* (2013.01); *G06F 1/1632* (2013.01)

(58) Field of Classification Search
CPC .............. H05K 5/00; H05K 7/00; G06F 1/06
See application file for complete search history.

(56) References Cited

U.S. PATENT DOCUMENTS

| | | | | | |
|---|---|---|---|---|---|
| 5,694,292 | A | * | 12/1997 | Paulsel et al. | 361/679.43 |
| 5,699,226 | A | * | 12/1997 | Cavello | 361/679.43 |
| 6,028,767 | A | * | 2/2000 | Lan | 361/679.43 |
| 6,034,869 | A | * | 3/2000 | Lin | 361/679.43 |
| 6,115,247 | A | * | 9/2000 | Helot | 361/679.44 |
| 6,142,593 | A | * | 11/2000 | Kim et al. | 312/223.2 |
| 6,208,508 | B1 | * | 3/2001 | Ruch et al. | 361/679.55 |
| 6,301,106 | B1 | * | 10/2001 | Helot et al. | 361/679.55 |
| 6,538,642 | B2 | * | 3/2003 | Tsai | 345/168 |
| 6,625,015 | B2 | * | 9/2003 | Yin | 361/679.4 |
| 7,038,908 | B2 | * | 5/2006 | Usui et al. | 361/679.41 |
| 7,286,344 | B2 | * | 10/2007 | Kim | 361/679.41 |
| 7,330,349 | B2 | * | 2/2008 | Chen et al. | 361/679.41 |
| 7,381,079 | B2 | * | 6/2008 | Chuang | 439/352 |
| 8,127,155 | B2 | * | 2/2012 | Baarman et al. | 713/300 |
| 8,185,681 | B2 | * | 5/2012 | Downing et al. | 710/304 |
| 8,503,172 | B2 | * | 8/2013 | Nakamura et al. | 361/679.49 |
| 2002/0154478 | A1 | * | 10/2002 | Kamimaki et al. | 361/686 |
| 2003/0147209 | A1 | * | 8/2003 | Oross et al. | 361/686 |
| 2003/0189812 | A1 | * | 10/2003 | Yin et al. | 361/686 |
| 2004/0052036 | A1 | * | 3/2004 | DeLuga | 361/679 |

(Continued)

FOREIGN PATENT DOCUMENTS

JP    07-319582 A    12/1995
JP    2011-118766 A   6/2011

*Primary Examiner* — Hoa C Nguyen
*Assistant Examiner* — Xanthia C Cunningham
(74) *Attorney, Agent, or Firm* — Westerman, Hattori, Daniels & Adrian, LLP

(57) ABSTRACT

A support device with a connector configured to be selectively connectable to a first sized portable device and a second sized portable device, a first support surface configured to support the first sized portable device, and a second support surface configured to support the second sized portable device and having a second inclination relative to a horizontal surface different than a first inclination of the first support surface.

17 Claims, 8 Drawing Sheets

(56) References Cited

U.S. PATENT DOCUMENTS

| | | | |
|---|---|---|---|
| 2004/0145864 A1* | 7/2004 | Usui et al. | 361/683 |
| 2005/0248917 A1* | 11/2005 | Hiroyoshi | 361/685 |
| 2006/0126290 A1* | 6/2006 | Park | 361/687 |
| 2007/0041156 A1* | 2/2007 | Chang et al. | 361/686 |
| 2007/0177347 A1* | 8/2007 | Nishiyama | 361/686 |
| 2008/0002353 A1* | 1/2008 | Carnevali | 361/686 |
| 2011/0141685 A1* | 6/2011 | Hung et al. | 361/679.43 |
| 2013/0279093 A1* | 10/2013 | Kim et al. | 361/679.01 |

\* cited by examiner

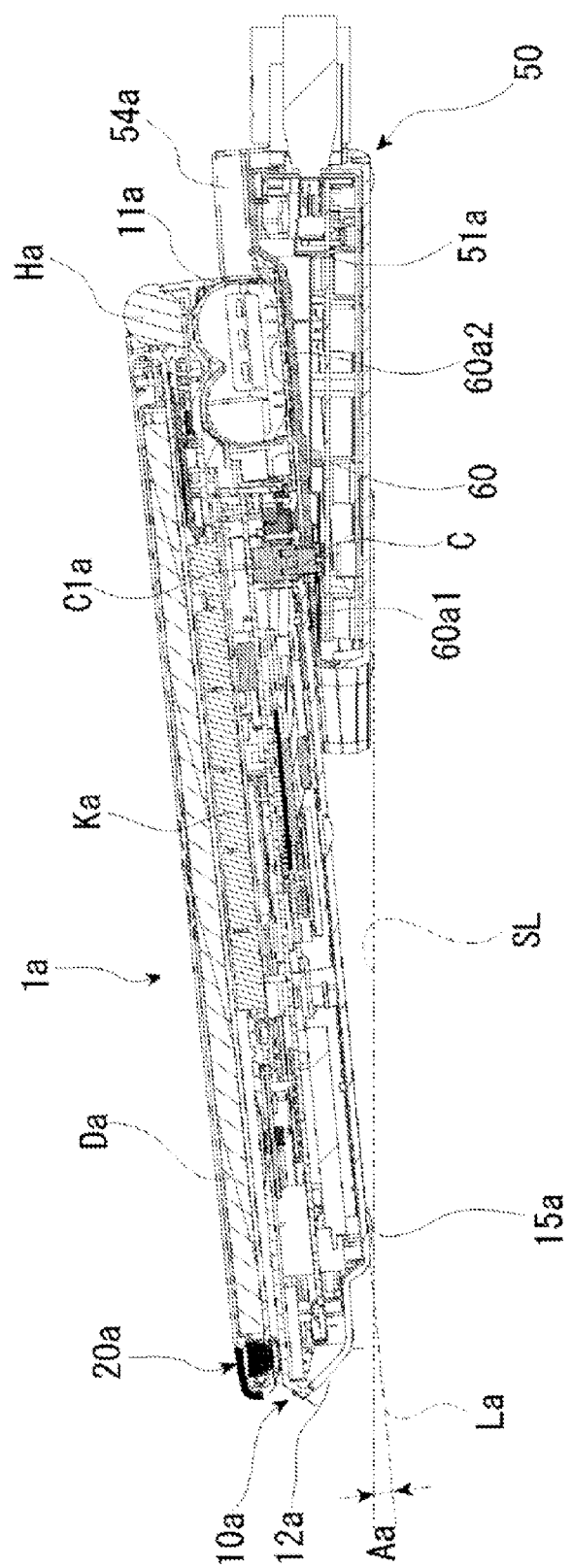

SUPPORT DEVICE AND SYSTEM

CROSS-REFERENCE TO RELATED APPLICATION(S)

This application is based upon and claims the benefit of priority of the prior Japanese Patent Application No. 2012-098220, filed on Apr. 23, 2012, the entire contents of which are incorporated herein by reference.

FIELD

The embodiment discussed herein is related to a support device and a system including a support device.

BACKGROUND

A support device expands a function of a portable device coupled thereto or supplies power to the portable device.

The related art is disclosed in Japanese Laid-open Patent Publication No. 7-319582.

SUMMARY

According to one aspect of the embodiments, a support device includes: a connector configured to be selectively connectable to a first sized portable device and a second sized portable device; a first support surface configured to support the first sized portable device; and a second support surface configured to support the second sized portable device and to have a second inclination relative to a horizontal surface different from a first inclination of the first support surface.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 8 is an exemplary cross-sectional view of a support device.

DESCRIPTION OF EMBODIMENT

The support device is individually designed and manufactured according to the shape and the size of the portable device. As such, the number of types of dedicated support devices are the same as the number of types of portable devices produced. Thus, the manufacturing cost of the support devices is increased.

Figure 1:
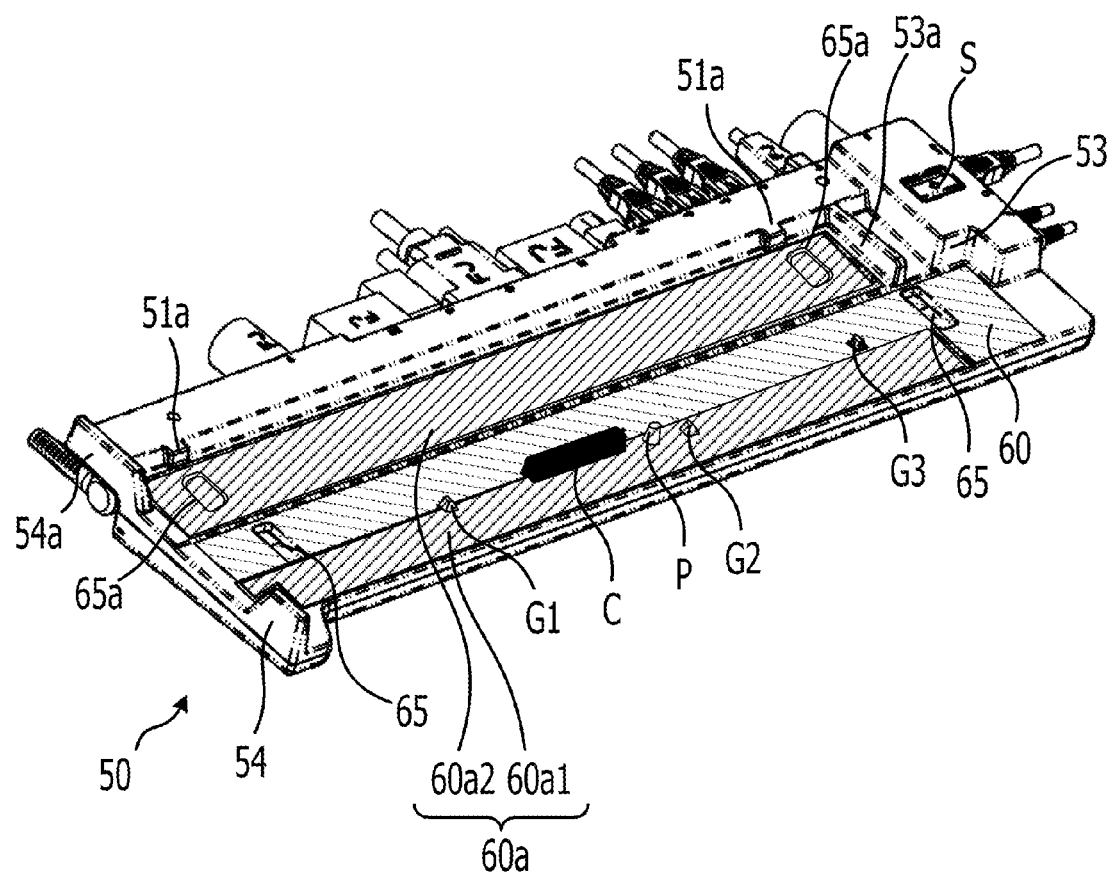
FIG. 1 illustrates an exemplary perspective view of a support device.

FIG. 1 illustrates an exemplary perspective view of a support device. The support device may be a port replicator. FIG. 1 is a perspective view of a port replicator 50. The port replicator 50 may support two types of portable devices, for example, notebook computers. FIG. 1 illustrates the port replicator 50 to which a plurality of connectors are coupled. The port replicator 50 is provided with terminals such as a serial port, a parallel port, a PS/2 port, a USB port, and an external display output connector. A plurality of connectors are coupled to a plurality of terminals, respectively. The plurality of terminals may be provided on the back side surface and/or the right and/or left side surfaces of the port replicator 50. A connector C for coupling a notebook computer is formed in the port replicator 50. A switch S may be provided for supplying or cutting power to a portable device connected via the connector C.

In the port replicator 50 of FIG. 1, support surfaces 60 and 60a for supporting two types of notebook computers (hereinafter, referred to as computers) are formed on the front surface side of the port replicator 50. For example, the computers 1 and 1a may be first and second portable devices having different sizes. The support surfaces 60 and 60a may have different inclinations. The support surface 60a includes regions 60a1 and 60a2 which are separated from each other so as to sandwich the support surface 60. The region 60a1 is formed toward the front side of the port replicator 50, and the region 60a2 is formed toward the back side of the port replicator 50. When the computer 1 is coupled to the connector C, the computer 1 is supported by the support surface 60. When the computer 1a is coupled to the connector C, the computer 1a is supported by the support surface 60a. The support surfaces 60 and 60a may be first and second support surfaces. The regions 60a1 and 60a2 may be first and second regions.

The support surface 60 includes two recesses 65 for storing leg portions of the computer 1. The region 60a2 of the support surface 60a includes two recesses 65a for storing leg portions of the computer 1a. A corner portion 53 and a projection portion 54 are provided for guiding the computer 1 to the support surface 60 when the computer 1 is mounted onto the port replicator 50. The corner portion 53 may correspond to a corner portion of the computer 1. The projection portion 54 is formed on the left side of the port replicator 50 and may correspond to a side of the computer 1. A projecting wall portion 51a and projection portions 53a and 54a are provided for guiding the computer 1a to the support surface 60a. The projection portion 54a is provided on the left side of the port replicator 50 similarly to the projection portion 54, and is located toward the back side of the projection portion 54. The projection portion 53a is provided toward the inner side and the back side of the corner portion 53.

Figure 2:
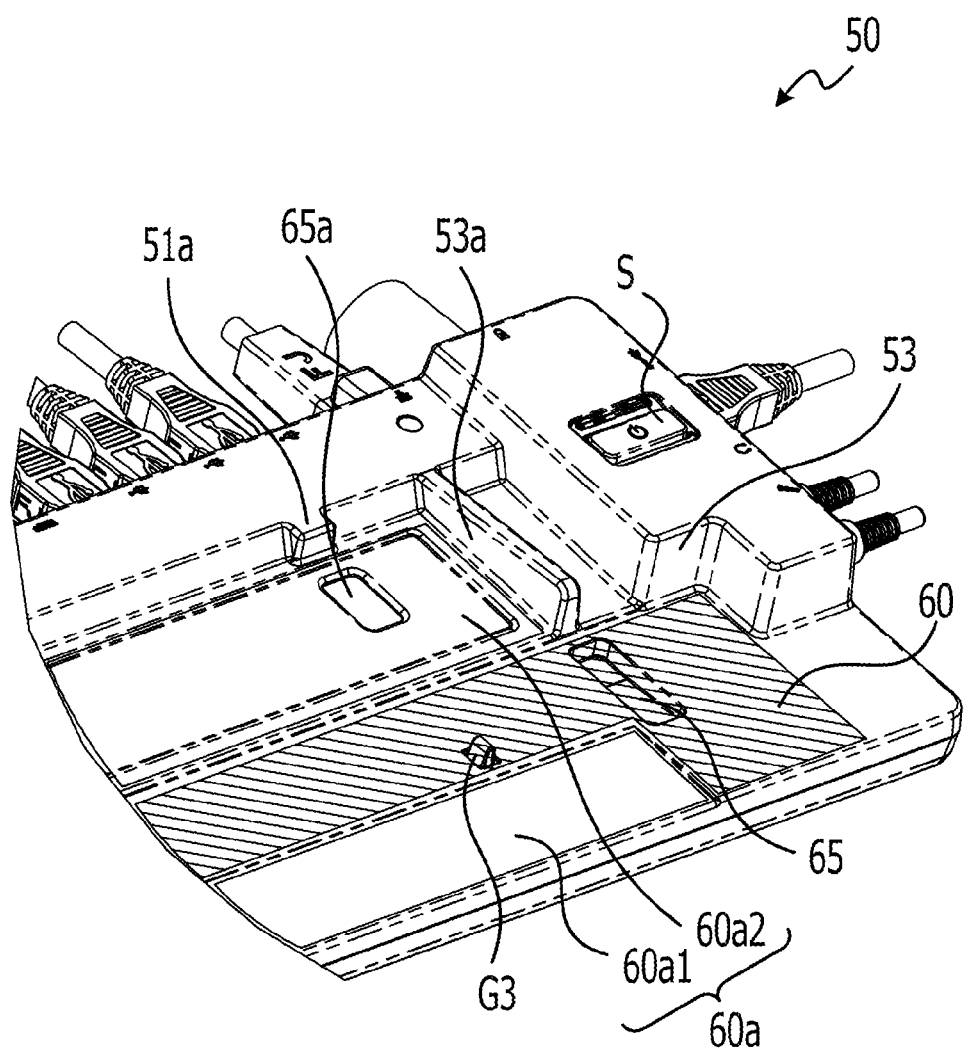
FIG. 2 illustrates an exemplary enlarged view of a support device.

FIG. 2 illustrates an exemplary enlarged view of a support device. FIG. 2 is a partially enlarged view of the port replicator 50. The inclination of the region 60a1 may be greater than that of the support surface 60. The inclinations of the regions 60a1 and 60a2 may be substantially the same. The region 60a1 may be formed in a position lower than that of the support surface 60. The region 60a2 may be formed in a position of higher elevation than that of the support surface 60.

Figure 3:
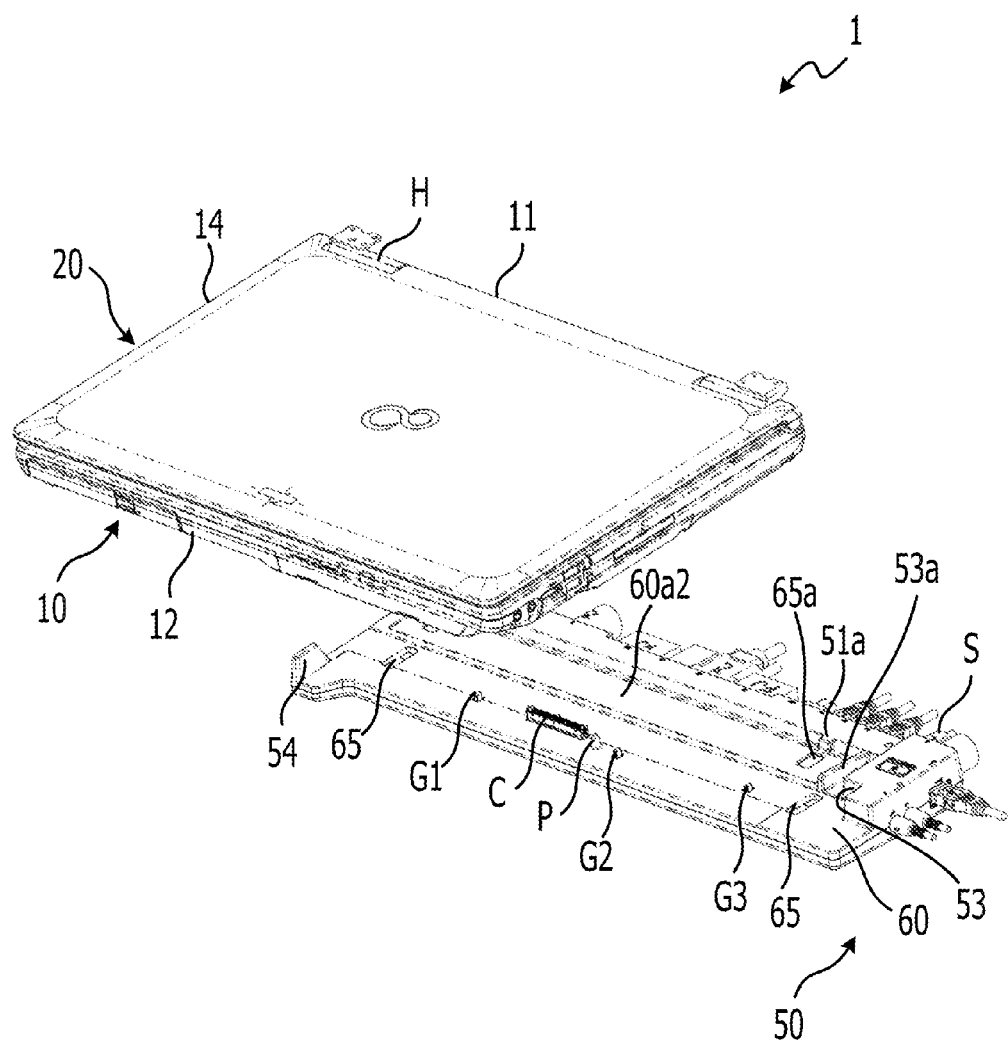
FIG. 3 illustrates an exemplary connection of a portable device to a support device.
Figure 4:
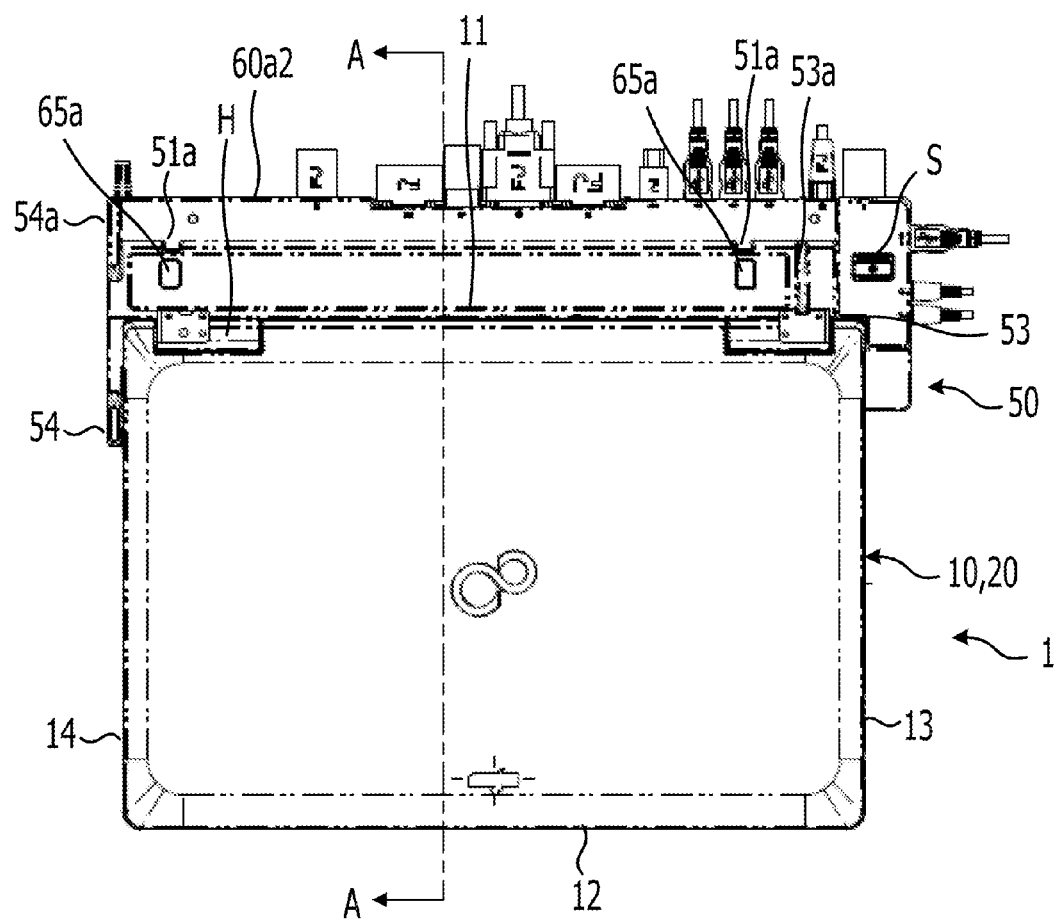
FIG. 4 illustrates an exemplary support device to which a portable device is coupled.
Figure 5:
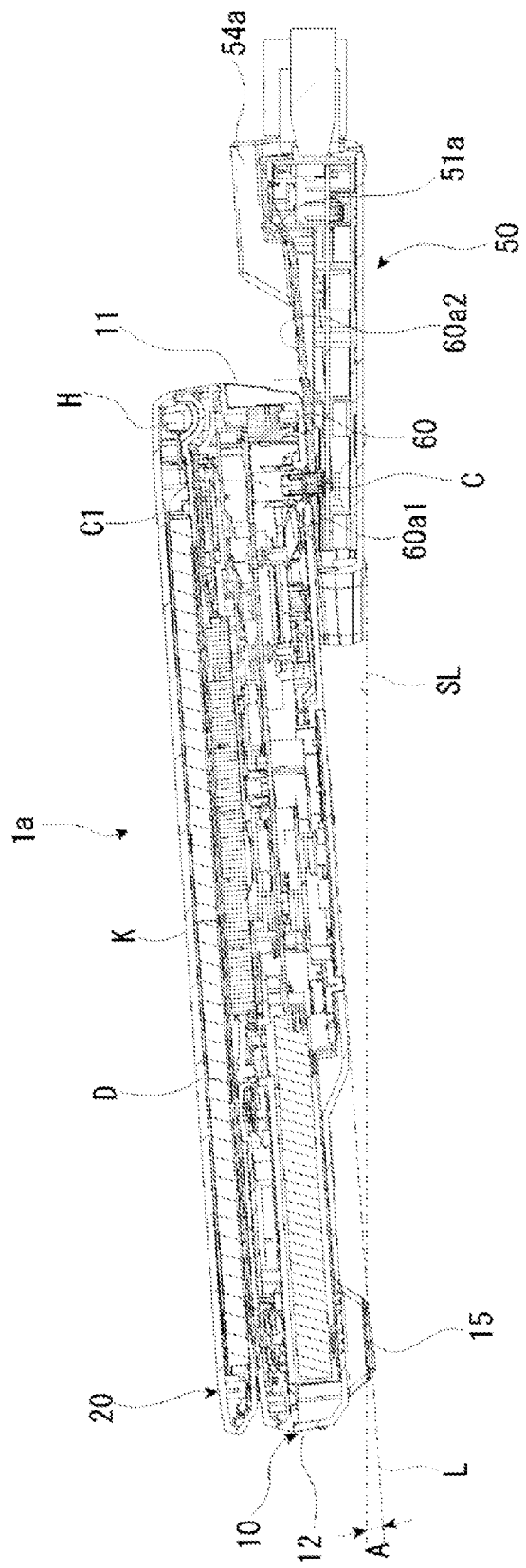
FIG. 5 illustrates an exemplary cross-sectional view of a support device.
Figure 6:
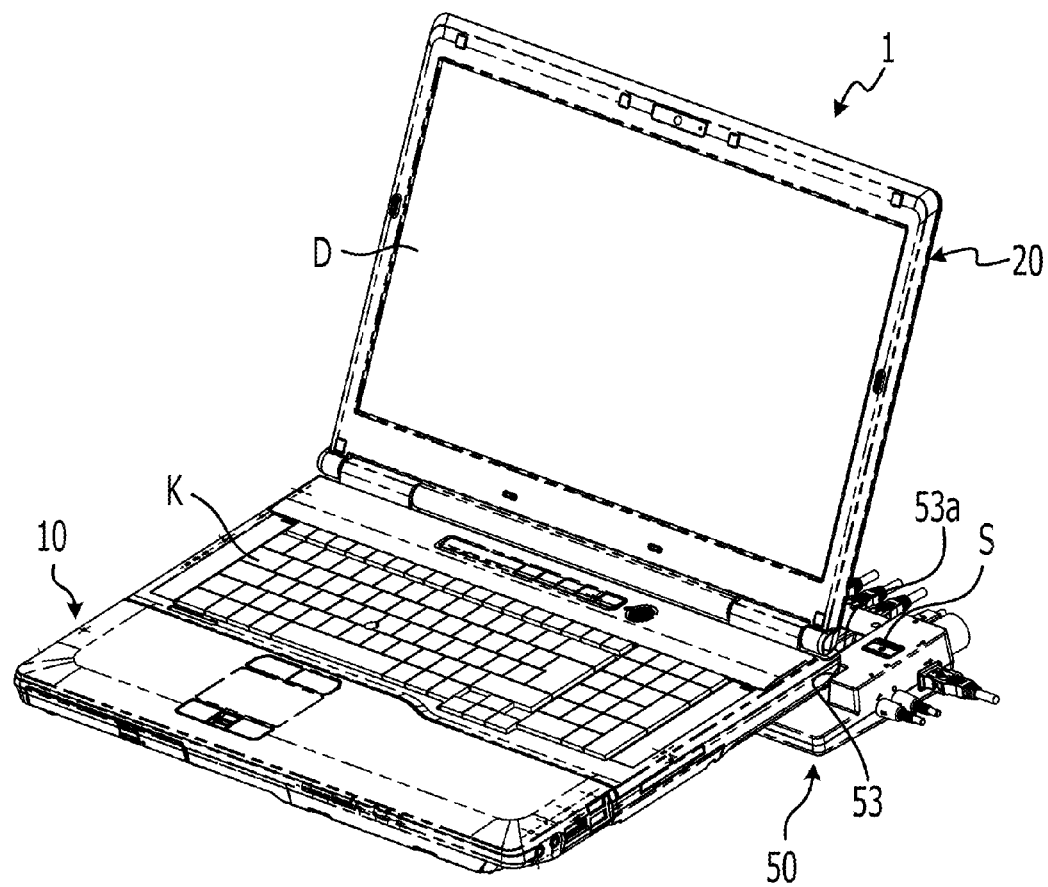
FIG. 6 illustrates an exemplary support device to which a portable device is coupled.

FIG. 3 illustrates an exemplary connection of a portable device to a support device. FIG. 3 is a perspective view of the computer 1 in relation to the port replicator 50. FIG. 4 illustrates an exemplary support device to which a portable device is coupled. FIG. 4 is a front view of the port replicator 50 to which the computer 1 is coupled. FIG. 5 illustrates an exemplary cross-sectional view of a support device. FIG. 5 is an A-A cross-sectional view of FIG. 4. FIG. 6 illustrates an exemplary support device to which a portable device is coupled. FIG. 6 may illustrate a use form of the computer 1 coupled to the port replicator 50. The computer 1 includes housings 10 and 20 which are coupled to each other via a hinge H such that these housings are able to be opened and closed. The housing 10 has a substantially rectangular shape and includes four sides 11 to 14. The sides 11 and 12 may be opposed to each other and the lengths thereof may be substantially the same. The sides 13 and 14 may be opposed to each other and the lengths thereof may be substantially the same. The sides 13 and 14 intersect the sides 11 and 12, respectively, and, for example, are orthogonal to the sides 11 and 12, respectively. As illustrated in FIG. 6, the housing 10 includes a keyboard portion K, and the housing 20 includes a display portion D. As illustrated in FIG. 5, a device connector C1 coupled to the connector C of the port replicator 50 is provided on the bottom side of the housing 10. Leg portions 15 are provided on the bottom of the housing 10.

Figure 7:
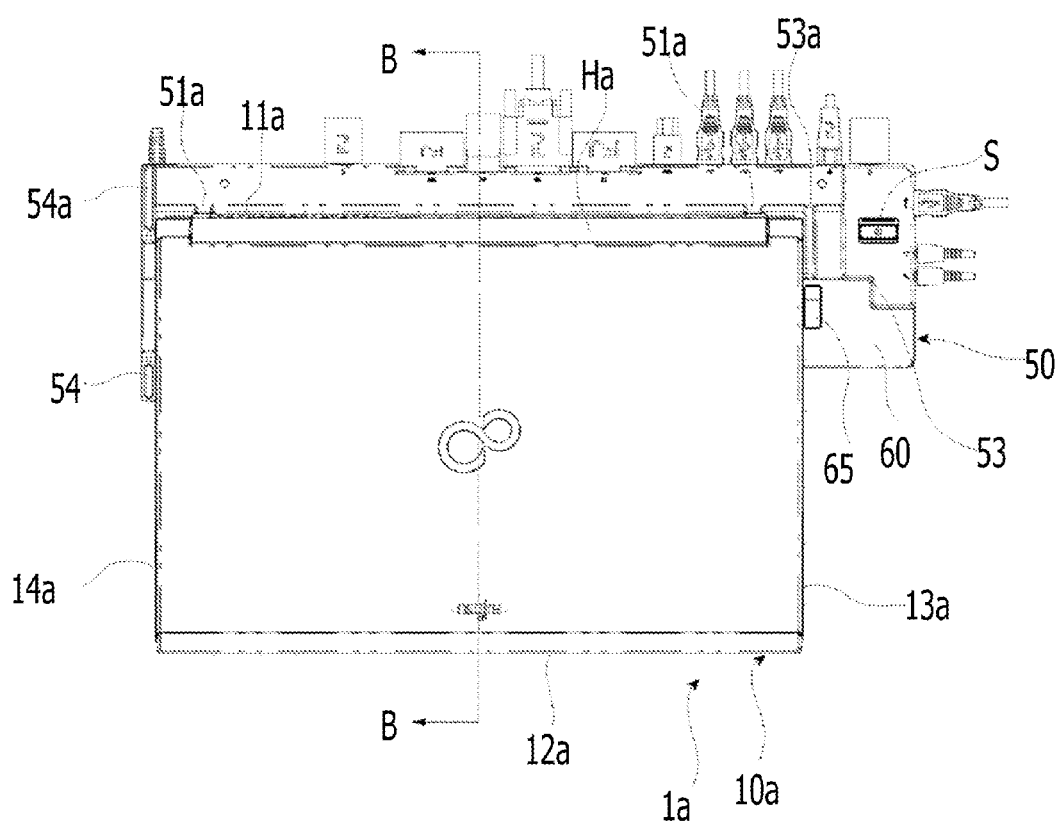
FIG. 7 illustrates an exemplary support device to which a portable device is coupled.

FIG. 7 illustrates an exemplary support device to which a portable device is coupled. FIG. 7 may be a front view of the port replicator 50 to which the computer 1a is coupled. FIG. 8 illustrates an exemplary cross-sectional view of a support device. FIG. 8 is a B-B cross-sectional view of FIG. 7. As illustrated in FIGS. 7 and 8, the computer 1a includes housings 10a and 20a, leg portions 15a, a hinge Ha, a keyboard portion Ka, a display portion Da, a connector C1a, and sides 11a to 14a. As illustrated in FIGS. 4 to 8, the port replicator 50 may partially support either the computers 1 or 1a. In FIGS. 5 and 8, a horizontal surface SL on which the port replicator 50 is located is indicated by a dotted line.

The computer 1 and 1a may have differences. The computer 1 may be larger than the computer 1a. The sides 11 and 13 may be longer than the sides 11a and 13a, respectively. For example, the size of the display portion D of the computer 1 may be 17 inches, and the size of the display portion Da of the computer 1a may be 15 inches. As illustrated in FIGS. 5 and 8, the distance from the connector C1 to the side 11 of the computer 1 may be shorter than the distance from the connector C1a to the side 11a of the computer 1a. The distance from the connector C1 to the side 12 may be longer than the distance from the connector C1a to the side 12a. For example, the length of each of the sides 13 and 14 of the computer 1 projecting from the port replicator 50 may be longer than the length of each of the sides 13a and 14a of the computer 1a projecting from the port replicator 50. The inclinations of the support surfaces 60 and 60a may be different from each other based on the difference between the lengths of the sides 13 and 14 of the computer 1 and the lengths of the sides 13a and 14a of the computer 1a.

As illustrated in FIG. 5, in a state where the connector C1 of the computer 1 is coupled to the connector C of the port replicator 50, the bottom of the housing 10 on the side 11 side of the computer 1 is supported by the support surface 60. The leg portions 15 on the side of the side 12 are in contact with the horizontal surface SL on which the port replicator 50 is located. As illustrated in FIG. 8, in a state where the connector C1a of the computer 1a is coupled to the connector C of the port replicator 50, the bottom of the housing 10a on the side of the side 11a of the computer 1a is supported by the support surface 60a. The leg portions 15a on the side of the 12a are in contact with the horizontal surface SL. In FIG. 5, an imaginary line L passing through the support surface 60 and the horizontal surface SL on which the port replicator 50 is located are illustrated. In FIG. 8, an imaginary line La passing through the support surface 60a is illustrated. The angle A between the imaginary line L and the horizontal surface SL may be lower than the angle Aa between the imaginary line La and the horizontal surface SL.

Since the support surfaces 60 and 60a have different inclinations, the port replicator 50 partially supports two types of the computers 1 and 1a having different sizes. For example, the inclination of the support surface 60a which supports the computer 1a projecting from the port replicator 50 by a short length may be greater than the inclination of the support surface 60 which supports the computer 1 projecting from the port replicator 50 by a long distance. Thus, even if port replicators corresponding to the computers 1 and 1a, respectively, are not manufactured individually, the port replicator 50 may be shared by the computers 1 and 1a. Thus, the manufacturing cost of the port replicator 50 may be reduced.

For example, when the computer 1a is supported to a port replicator with a single support surface that supports the computer 1, since the length of the side 13a of the computer 1a is shorter than that of the side 13 of the computer 1, the side of the side 11a of the housing 10 of the computer 1a may rise from the horizontal surface SL. Hence, the computer 1a may not be stably supported. However, since the support surfaces 60 and 60a have different inclinations, the port replicator 50 supports the two types of computers 1 and 1a.

For example, when the computer 1a is supported to the port replicator 50 by the single support surface that supports the computer 1, the connectors C1 and C1a may be provided such that the distance from the connector C1 to the side 11 of the computer 1 is substantially the same as the distance from the connector C1a to the side 11a of the computer 1a. Since a large number of parts are arranged within each of the computers 1 and 1a, the connectors C1 and C1a may not be arranged freely. Since the inclinations of the support surfaces 60 and 60a that support the computers 1 and 1a are different, the two computers 1 and 1a may be supported by the port replicator 50.

The connector C may be provided near the boundary between the support surfaces 60 and 60a, for example, near the boundary between the support surface 60 and the region 60a1. Thus, the computer 1 supported by the support surface 60 or the computer 1a supported by the support surface 60a may be selectively coupled to the connector C. Since the connector C is shared, connectors corresponding to the computers 1 and 1a, respectively, may not be provided. The structure of the port replicator 50 may be simplified and the cost may be reduced.

A difference between the lengths of the support surfaces 60 and 60a in the longitudinal direction of the port replicator 50 may be set based on the difference between the lengths of the sides 11 and 11a. Thus, the length of the support surface 60 in the longitudinal direction of the port replicator 50 may be longer than the length of the support surface 60a.

As illustrated in FIG. 4, the corner portion 53 faces a corner portion defined by the sides 11 and 13 of the computer 1, and the projection portion 54 faces the side 14 of the housing 10. As illustrated in FIG. 7, the projection portion 53a faces the side 13a of the computer 1, the projection portion 54 faces the side 14a, and the projecting wall portion 51a faces the side 11a. For example, when the computer 1 is located on the region 60a2, the projection portion 53a may interfere with the housing 10 of the computer 1 and hence the computer 1 may not be located on the region 60a2. Thus, the possibility may be reduced that the computer 1a is erroneously located on the region 60a2. For example, when the computer 1 is erroneously located on the region 60a2, breakage of the connector C caused by the connector C coming into contact with the bottom of the housing 10 may be reduced. The projection portion 53a may be a guide portion.

The support surface 60a may include the two regions 60a1 and 60a2 separated from each other. Thus, the area of the support surface 60a that supports the computer 1a may be increased, and the computer 1a may be stably supported. When the computer 1a is supported by the support surface 60a, the computer 1a may not be in contact with the support surface 60. When the computer 1 is supported by the support surface 60, the computer 1 may not be in contact with the support surface 60a.

As illustrated in FIGS. 1 and 3, a guide pin P is provided near the connector C. Holes are provided in the computers 1 and 1a so as to correspond to the guide pin P. Since the guide pin P is inserted into the hole of the computer 1 or the computer 1a, the computer 1 or the computer 1a is guided to the connector C. Thus, the operation for coupling the computers 1 and 1a to the connector C may become easy.

As illustrated in FIGS. 1 to 3, connection portions G1 to G3 are provided in the support surface 60 and the region 60a1. The connection portions G1 to G3 are provided so as to emerge from openings formed in the port replicator 50. The connection portions G1 to G3 may include metal. Plates having ground potentials are provided in the housings 10 and 10a. When the computer 1 or 1a is coupled to the connector C, at least one of the connection portions G1 to G3 may be conductively coupled to the plate having the ground potential in the housing 10 or 10a.

Each portable device may be, for example: a notebook computer, a tablet computer, a mobile phone, a portable television, an electronic dictionary, a PDA, a game device, a camera, a music player, a navigation device or similar portable device.

The support device may be, for example: a port replicator, a recharger that is connectable to each portable device, an adaptor for supplying commercial power to each portable device, or a similar support device.

The support surface 60a may be divided into two regions. The support surface 60a may include only either the region 60a1 or the region 60a2.

The portable devices may be two notebook computers having different sizes. The support device may be able to be shared by a mobile phone and a portable device other than the mobile phone such as a tablet computer.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that various changes, substitutions, and alterations could be made hereto without departing from the spirit and scope of the invention.

What is claimed is:

1. A support device comprising:
    a connector configured to be selectively connectable to a plurality of portable devices of varying sizes;
    a first support surface of a first size configured to support first sized portable devices of said plurality of portable devices, the first support surface having a first inclination relative to a horizontal surface; and
    a second support surface of a second size different from said first size, and configured to support second sized portable devices of said plurality of portable devices, the second support surface having a second inclination relative to the horizontal surface,
    wherein the first inclination is different from the second inclination,
    wherein the second support surface includes a first region and a second region that sandwich the first support surface.

2. The support device according to claim 1, wherein the second support surface has a shorter length in a longitudinal direction than the first support surface.

3. The support device according to claim 1, wherein the connector is provided at a boundary between the first and second support surfaces.

4. The support device according to claim 1, further comprising, a guide portion configured to guide the second sized portable devices to the second support surface and to restrain the first sized portable devices from being supported by the second support surface.

5. The support device according to claim 4, further comprising, a projection portion positioned on an opposite side of the second support surface to the guide portion and configured with the guide portion to guide the second sized portable devices to the second support surface and to restrain the first sized portable devices from being supported by the second support surface.

6. The support device according to claim 1, further comprising a guide pin adjacent to the connector.

7. The support device according to claim 1, further comprising connection portions in the first support surface and the second support surface.

8. A system comprising:
    a support device including a connector configured to be coupled to a first portable device including a first side and a second side that intersects each other or a second portable device including a third side and a fourth side that intersect each other; and
    a portable device as the first portable device or the second portable device, wherein the support device includes: a first support surface configured to support the first-side side of the first portable device; and a second support surface configured to support the third-side side of the second portable device and to have a greater inclination relative to a horizontal surface than a inclination of the first support surface,
    wherein the second support surface includes a first region and a second region that sandwich the first support surface.

9. The system according to claim 8, wherein the fourth side is shorter than the second side.

10. The system according to claim 8, wherein the connector is provided at a boundary between the first support surface and the second support surface.

11. The system according to claim 8, further comprising, a guide portion configured to guide the second portable device to the second support surface and to restrain the first portable device from being supported by the second support surface.

12. The system according to claim 11, further comprising, a projection portion positioned on an opposite side of the second support surface to the guide portion and configured with the guide portion to guide the second sized portable devices to the second support surface and to restrain the first sized portable devices from being supported by the second support surface.

13. The system according to claim 8, further comprising a guide pin adjacent to the connector.

14. The system according to claim 8, further comprising connection portions in the first support surface and the second support surface.

15. The system according to claim 8, wherein the portable device is one of the group consisting of a notebook computer, a tablet computer, a mobile phone, a portable television, an electronic dictionary, a PDA, a game device, a camera, a music player and a navigation device.

16. A support device comprising:
- a connector configured to be selectively connectable to a first portable device including a first side and a second side that intersect each other and a second portable device including a third side and a fourth side that intersect each other;
- a first support surface configured to support the first-side side of the first portable device; and
- a second support surface configured to support the third-side side of the second portable device and to have a second greater inclination relative to a horizontal surface a first inclination that of the first support surface,
- wherein the connector is provided at a boundary between the first and second support surfaces.

17. The support device according to claim 16, wherein the fourth side is shorter than the second side.

* * * * *